(12) United States Patent
Adams et al.

(10) Patent No.: US 12,387,025 B1
(45) Date of Patent: Aug. 12, 2025

(54) AGGREGATING MULTIPLE COMPONENT METRICS INTO A SINGLE REWARD FUNCTION

(71) Applicant: Synopsys, Inc., Mountain View, CA (US)

(72) Inventors: Amzie Allen Adams, Raleigh, NC (US); Joseph Robb Walston, Durham, NC (US)

(73) Assignee: SYNOPSYS, INC., Mountain View, CA (US)

( * ) Notice: Subject to any disclaimer, the term of this patent is extended or adjusted under 35 U.S.C. 154(b) by 363 days.

(21) Appl. No.: 17/969,423

(22) Filed: Oct. 19, 2022

Related U.S. Application Data (60) Provisional application No. 63/257,495, filed on Oct. 19, 2021.

(51) Int. Cl.
*G06F 30/27* (2020.01)
*G06F 30/337* (2020.01)

(52) U.S. Cl.
CPC ............ *G06F 30/337* (2020.01); *G06F 30/27* (2020.01)

(58) Field of Classification Search
None
See application file for complete search history.

(56) References Cited

U.S. PATENT DOCUMENTS

2024/0249058 A1* 7/2024 Goldie .................. G06F 30/398

OTHER PUBLICATIONS

T. Brys et al., "Multi-Objectivization of Reinforcement Learning Problems by Reward Shaping," 2014 Int'l Joint Conference on Neural Networks (IJCNN), Beijing, China, pp. 2315-2322. (Year: 2014).*

* cited by examiner

*Primary Examiner* — Leigh M Garbowski
(74) *Attorney, Agent, or Firm* — Jaquez Land Greenhaus & McFarland LLP; Bruce W. Greenhaus (57) ABSTRACT

A method and apparatus for aggregating multiple component metrics into a single reward function output value (AOV) is disclosed. The method comprises determining at least one component metric value to be used to determine the AOV. In addition, the method comprises determining at least one component metric target value to strive to achieve. Furthermore, the method comprises determining at least one baseline value to use when determining the AOV. Still further, the method comprises determining unacceptable values for particular component metrics. The method also comprises combining at least one component metric value into a single AOV and optimizing component input values to achieve the best AOV.

20 Claims, 6 Drawing Sheets

AGGREGATING MULTIPLE COMPONENT METRICS INTO A SINGLE REWARD FUNCTION

CROSS-REFERENCE TO RELATED APPLICATIONS—CLAIM OF PRIORITY

The present application claims priority to U.S. Provisional Application No. 63/257,495, filed Oct. 19, 2021, entitled "Aggregating Multiple Component Metrics into a Single Reward Function", which is herein incorporated by reference in its entirety.

TECHNICAL FIELD

The present disclosure relates to systems for designing and checking the designs of integrated circuits and more particularly to providing a reward function that drives searches for improved component input values.

BACKGROUND

When designing integrated circuit chips (ICs), designers need to make many choices. Examples of these choices include the size of the chip, the aspect ratio of the chip, pin placement within the chip, placement of components within the chip, power distribution, design flow, timing margin, and how to set various design tool parameters. Each choice serves as an input parameter (i.e., a design input component variable having a particular component input value) to the design process. Each such input parameter impacts the quality of the final chip to be designed. The union of all of the design choices made and the input parameters that result from those choices can be expressed as a "design-search space". Design-search spaces are typically very large (e.g., $10^{12}$ possible combinations). Accordingly, it is very difficult to search the entire design-search space.

SUMMARY

A method and apparatus for aggregating multiple component metrics into a single reward function output value, such as an AOV (ADES (Aggregate Design Score) output value) is disclosed. The method comprises determining at least one component metric value to be used to determine the AOV. In addition, the method comprises determining for each component metric value, a corresponding component metric target value that the disclosed method and apparatus strives to achieve for the associated component metric value. In the course of attempting to achieve the component metric target values, the disclosed method and apparatus adjust the component input values, which in turn alters associated component metric values. The method and apparatus also determine at least one baseline value to use when determining the AOV. In some embodiments, the method and apparatus determine an unacceptable value for some or all of the component metrics. The method and apparatus also combine component metric values into a single AOV. By adjusting the component input values, the component input values are optimized to achieve the best AOV. In some embodiments, AOVs are determined for a plurality of design implementations to determine which of the plurality of implementations is most desirable (i.e., performs best as indicated by the AOV).

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to methods and systems for aggregating multiple component metrics into a single reward function that enables machine learning-driven optimization of multiple component input values. An ADES (Aggregate Design Score) is disclosed that allows designers working with a design tool to easily specify the component metrics they want the design tool to optimize, which component metric targets the design tool should strive to achieve, what values are unacceptable for particular parameters that are optimized in the course of the design, and what tradeoffs are desired between various design parameters. It should be noted that throughout this disclosure, the phrases "component input values" and "component metric values" are used. For the purpose of this disclosure, component input values are values that indicate a physical size, distance, measure of an electrical value, such as capacitance, inductance or resistance, or other such quantity or other value related to the design. Component metric values are values used to evaluate an aspect of the performance of a component of design or the effect of one or more design component inputs having a particular component input value or a change in the component input value. In some cases, a component input value may serve as a component metric. For example, chip size is a design component input, but the particular value of the design component input may also be a component metric used to evaluate the performance of a circuit within the design or the design as a whole.

The disclosed method and apparatus automatically combine an arbitrary number of component metrics into a single reward function, referred to as the AOV (ADES output value), that drives a ML-based (machine learning based) search for improved component input values. The disclosed method and apparatus also rank different design implementations based on an arbitrary number of component metrics. Lower values output from the reward function are better. In some embodiments, designers can apply parameters associated with different design implementations to determine which implementations are best (i.e., have the lowest value from the reward function).

Some embodiments use machine learning to efficiently search spaces of any size. A "reward function" drives the search in such embodiments. The reward function captures what the designer wants to optimize and provides as an output, a single real number. The reward function also captures component metric targets and tradeoffs the designer wants to achieve. Designers typically optimize many different component metrics simultaneously. Examples include, but are not limited to, (1) achieved frequency, (2) total power, (3) chip size, and (4) routing violations (such as expressed by DRCs (Design Rule Checks) performed on the design). Many of the component metrics that are provided to the design tool for evaluation of the design, have different units and respond differently to changes in related component input values. Depending on the design choices, power consumption may change by only a few percent, whereas DRCs may change by four orders of magnitude. Design parameters and component metrics also compete against each other. For example, increasing the frequency almost always degrades power efficiency and consequently increases power consumption, and vice-versa. Designers typically decide: (1) what component metrics are most important, (2) what component metric targets they want to achieve, (3) what values are unacceptable for specific design parameters, and (4) what design tradeoffs they are willing to accept. The decisions of the designer may change significantly over the course of the design cycle. In the early stages of the design, the designer may be primarily concerned with assessing timing and routing feasibility. Closer to tape out, the designer may be more focused on hold and DRC closure.

Advantages of the present disclosure include, but are not limited to, more easily optimizing component input values using the metrics that are of importance to the designer and providing a single metric that represents how well the optimization has been done thus far in the process of optimizing values for the component inputs. The use of the disclosed method and apparatus thus results in a more efficient design process (i.e., more efficient use of processing resources) and design that has better performance than would result without such optimization.

In some embodiments of the disclosed method and apparatus, what a chip designer wants to achieve is captured as a single floating-point number representing a reward function output value, referred to throughout this disclosure as the AOV (ADES output value). The AOV is generated using a reward/punishment function, which in some embodiments is used by an ML-driven search for improvements to component input values.

In some embodiments, a designer configures the disclosed method and apparatus (hereafter referred to simply as "ADES") by first providing a list of the component metrics the designer wants to optimize. ADES has several dozen built-in metrics. The built-in metrics cover the vast majority of what designers typically want to optimize. Examples include but are not limited to: (1) worst negative slack, (2) total negative slack, (3) total power, (4) leakage power, (5) congestion, (6) hold slack, and (7) routing rule violations.

Next, the designer specifies component metric target values for each of a plurality of component metrics. Component metric target values represent values at the highest desired level of satisfaction of the designer's design goals. Values that are better than the component metric target values are not sought, since they may result in compromises in other parameters or unjustified additional expense in the design or end product without an accompanying benefit or value that is greater than the cost required to achieve such benefit. For the purpose of this discussion, such benefit is termed "negligible".

In some embodiments, during the course of an ML search of component input values, the AOV improves as component metrics moves closer to component metric target values. In some such embodiments, if a component metric becomes better than its component metric target value, the disclosed method and apparatus stops improving that component. In some embodiments, halting the process of improving parameters when the component metric target values have been achieved, places an emphasis on improving other component metrics. At the same time, this allows the values for component input values associated with component metrics that have achieved their component metric target values to be preserved. In some embodiments, the component metric target values are set by the designer for the component metrics associated with those targets.

In some embodiments, designers also specify baseline values for each component metric. A baseline value is a typical value the designer expects to achieve. Baselines are usually taken from the starting design flow the designer is trying to optimize. If a component is better than the baseline value, the disclosed method and apparatus continues to adjust parameters that can result in improvements to the component metric until the associated metric reaches the component metric target value set for that component metric. If a component metric is worse than the baseline value for that component metric, the AOV is degraded.

Figure 1:
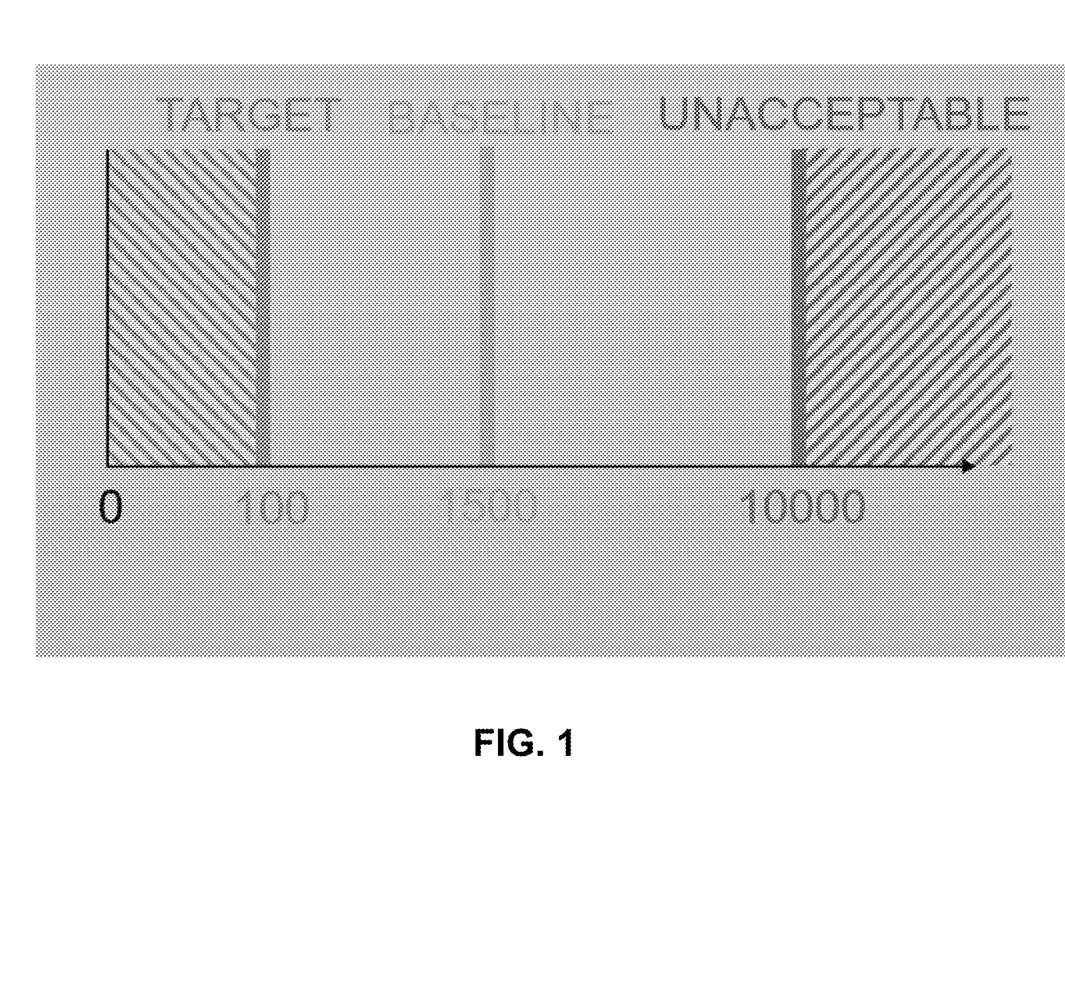
FIG. 1 is an illustration of the relationship between component metric target values, baseline values and unacceptable values.

In addition, in some embodiments, designers also specify a value that represents a level that is unacceptable for each component metric. FIG. 1 is an illustration of the relationship between component metric target values, baseline values and unacceptable values. In the example shown, the component metric has a component metric target value of 100, a baseline value of 1,500 and an unacceptable value of 10,000. The figure depicts that values smaller than 100 fall within the component metric target value domain. Likewise, values above 10,000 fall within the unacceptable domain. If any component metric becomes worse than its unacceptable value, the AOV degrades dramatically, regardless of how good any other component metric might be. In some embodiments, unacceptable values are optional. In addition, in some embodiments, if the designer is using only built-in component metrics (component metrics that are provided by the system prior to any customization by the designer), the ADES automatically self-configures. That is, there is no need to specify anything other than the list of component metric names for each component metric to be optimized. In such embodiments, ADES automatically determines baseline and component metric target values for all component metrics. Designers can also include 'custom' component metrics.

In some embodiments, ADES provides a simple Tcl (tool command language) interface that allows a designer to calculate values, such as IR drop, specific clock frequencies, etc. In some such embodiments, the Tcl script used returns a floating-point number. In some embodiments, designers can mix and match custom component metrics with built-in component metrics. Also, in some embodiments there is no limit to the number of component metrics a designer can use.

Figure 2:
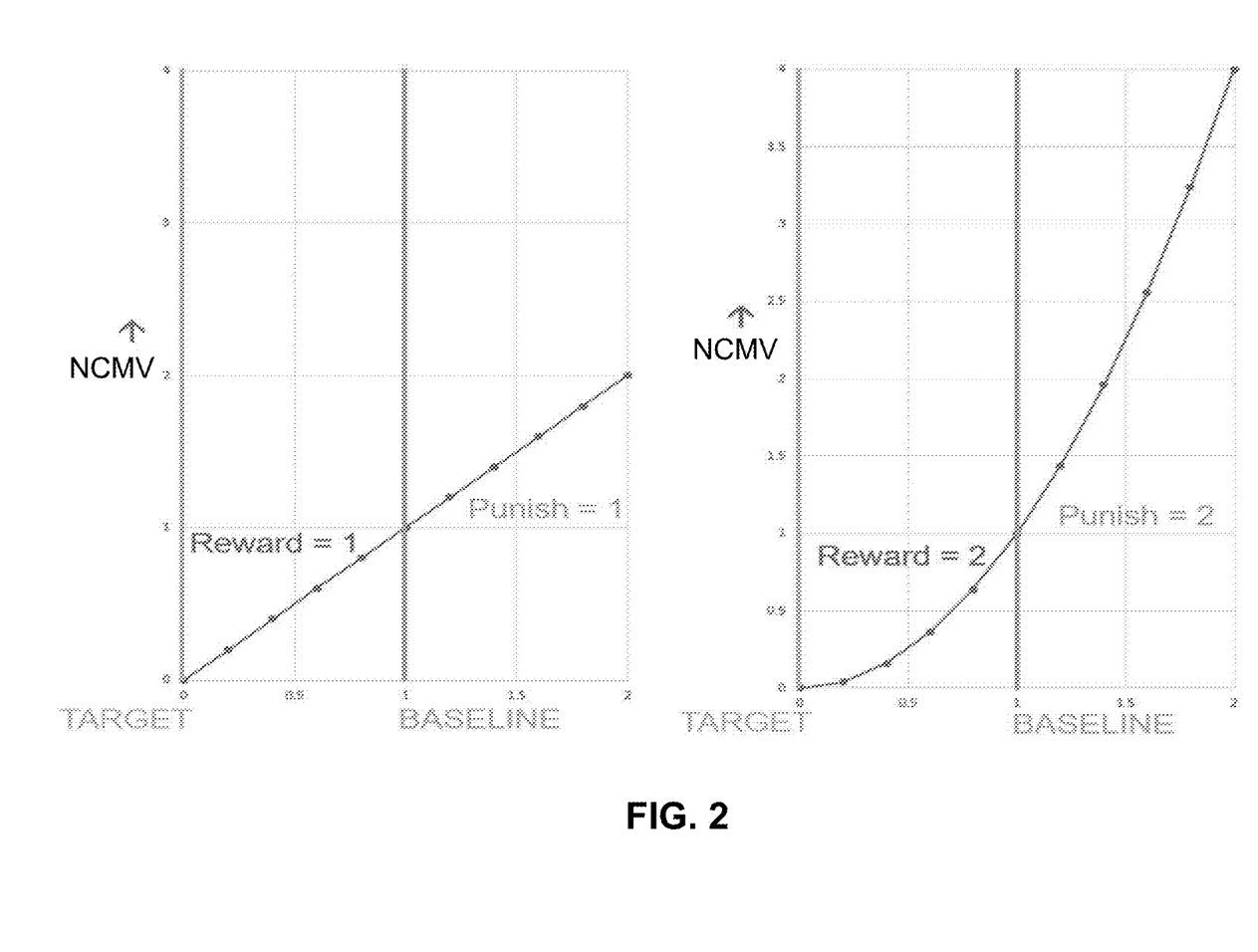
FIG. 2 illustrates the component metric normalization process and the impact of different punish/reward settings.

FIG. 2 illustrates the component metric normalization process and the impact of different punish/reward settings. In some embodiments, designers can specify component metric weights. Component metric weights control the relative amount of focus (i.e., significance) allotted to each component metric. A component metric weight allows the designer to control the component metric tradeoffs made during the design process. Component metric weights are floating-point numbers. The default weight is 1.0. In some embodiments, if the designer wants to focus twice as much on "metric 4" than on "metric 3", the designer sets the weight of metric 4 to 2.0, maintaining the default weight of metric 3 at 1. In addition to component metric weights, in some embodiments, the disclosed method and apparatus offers offer more advanced controls for each component. These additional advanced controls alter the AOV by "punishing" (i.e., degrading the AOV) and "rewarding" (improving the AOV). The punishment and reward settings control how quickly the AOV improves or degrades when component metrics get better or worse than the baseline associated with each component metric.

In some embodiments, the disclosed method and apparatus supports varied component metrics that may initially have different units, scales and ranges prior to normalization. Some component metrics may be positive, others may be negative, while others have a range that spans both positive and negative values. Some component metrics may need to be maximized while others need to be minimized. In one embodiment, each component input value is normalized in order to allow all of the components to be combined into a single design score (i.e., the AOV). Normalization provides a more uniform scale and range of values to which each of the component metrics adheres. During the component metric normalization process, each component metric value is transformed into an NCMV (Normalized Component Metric Value). That is, values of each component metric are mapped to corresponding values of an NCMV associated with that component metric. The NCMVs are each positive values. Furthermore, the normalization of the metric components ensures that a lower value for each NCMV indicates better performance by the integrated circuit under design. It should be understood that "better performance" is a criterion that can be defined for each component metric by the integrated circuit designer. Alternatively, the criteria for defining "better performance" are determined prior to the designer defining parameters for the process (i.e., as default values to the process).

As part of the normalization process, each component metric is normalized such that when the component metric is equal to the component metric target value, the corresponding NCMV value is 0. The component metric values are then scaled such that the NCMV value is equal to 1.0 when the corresponding component metric value is equal to the baseline value for that component metric. As a result, the component metric normalization process creates a "unity box" for all component metric values. It can be seen that NCMV values greater than 1 indicate that the corresponding component metric value results in a performance that is not as good as a performance that occurs at the baseline value. Accordingly, it can be seen that each NCMV is equal to 0 when the associated component metric value reaches its component metric target value and the NCMVs are each equal to 1.0 when the associated component metric value reaches the associated baseline value for that component metric. In some embodiments, the punish/reward settings are exponents that control the amount of degradation/improvement when a component metric value strays from its baseline value. The fact that each NCMV is equal to 1.0 when the associated component metric value equals the baseline value associated with that component metric ensures that the values for the NCMV remain continuous at the reward/punish boundary.

Once all component metric values have been normalized, the AOV is determined by summing each NCMV. In some embodiments, each component metric value can be weighted independently. That is, each component metric value is multiplied by an associated component metric weight to generate a Weighted NCMV (WNV). The WNVs are summed and then divided by the sum of the weights of WNVs to determine an AOV.

In one example provided to demonstrate this, three NCMVs associated with three corresponding component metrics have the values of 1.0, 1.5 and 0.5, respectively. Furthermore, these three NCMVs are assigned weights of 1, 1 and 4, respectively. The resulting WNVs are then 1, 1.5 and 2, respectively. When combined to derive an AOV, the AOV is equal to (1+1.5+2)/6=4.5/6. If the NCMVs without weighting are used to derive the AOV, the value of the AOV would be (1.0+1.5+0.5)/3=3/3. It can be seen from this example that by applying a relatively large weight (i.e., "4") to the third NCMV whose value is 0.5 (i.e., less than one), the resulting value of the AOV drops from 1 (i.e., 3/3) to 4.5/6, so that there is greater "focus" placed on the value of the third NCMV. In another example in which the NCMVs have the same values, but the respective weights are 1, 4 and 1, the AOV is equal to 9/6, reflecting the greater focus on the second component metric, which has a value greater than 1.

Alternatively, the denominator used to derive the AOV remains equal to the number of NCMVs (i.e., "3" in the two examples above). In this case, the absolute value of the NCMV is adjusted. The adjustment can be either to a larger value or to a smaller value.

In addition to making it possible to combine the various component metrics, normalization of the component metrics makes the AOV robust. That is, should an implementation fail to capture some components, the resulting AOV would still be appropriate, even though the particular component metric that was lost was not included, assuming the denominator used to derive the AOV takes into account the number and weights of the remaining component metrics. In the presently disclosed method and apparatus, normalizing over the total number of components helps ensure that all instances of the design can be fairly compared to one another, even if some of the instances being compared are missing some component input values.

The disclosed method and apparatus perform component metric normalization of the component input values, uses a reward/punish feature to contour the component input values, and combines the WNVs to form the AOV. However, designers can choose to use whatever function they want on a component-by-component basis. Accordingly, the disclosed method and apparatus allows each component input value to use a completely different function. Such functions may be selected and/or generated by the designer at the designer's discretion. The disclosed method and apparatus also support mixed control in which users can let the disclosed method and apparatus self-configure some component metrics (i.e., use default settings) while exerting full designer control over others. This provides unlimited flexibility in how designers choose to score a plurality of design implementations.

Details Regarding Component Metric Normalization Procedures

The AOV associated with any particular chip implementation is derived from multiple component metric values (i.e., component metrics such as TNS (Total Network Slack), DRC, and POWER). Contributions from each component metric value are added together to generate the final AOV for the chip implementation. The final AOV is normalized by dividing the sum by the total number of components that were found. This final normalization improves scoring robustness in case some chip implementations fail to capture one or more component input values associated with one or more of the relevant component metrics for the design. Such a failure might be due, for example, to a disk access issue at runtime.

The disclosed method and apparatus allow users to calculate the contribution of a particular component input value to the AOV using any function the designer desires. Regardless of the functions used to generate each WNV, the final AOV for each chip implementation (i.e., a particular implementation of the design) undergoes the normalization described above to improve scoring robustness.

The disclosed method and apparatus provide two built-in WNV functions. These two functions are identical, except that the first generates WNVs on a logarithmic scale, while the second generated WNVs on a linear scale. Both functions normalize each component by performing the following transformations.

Figure 3:
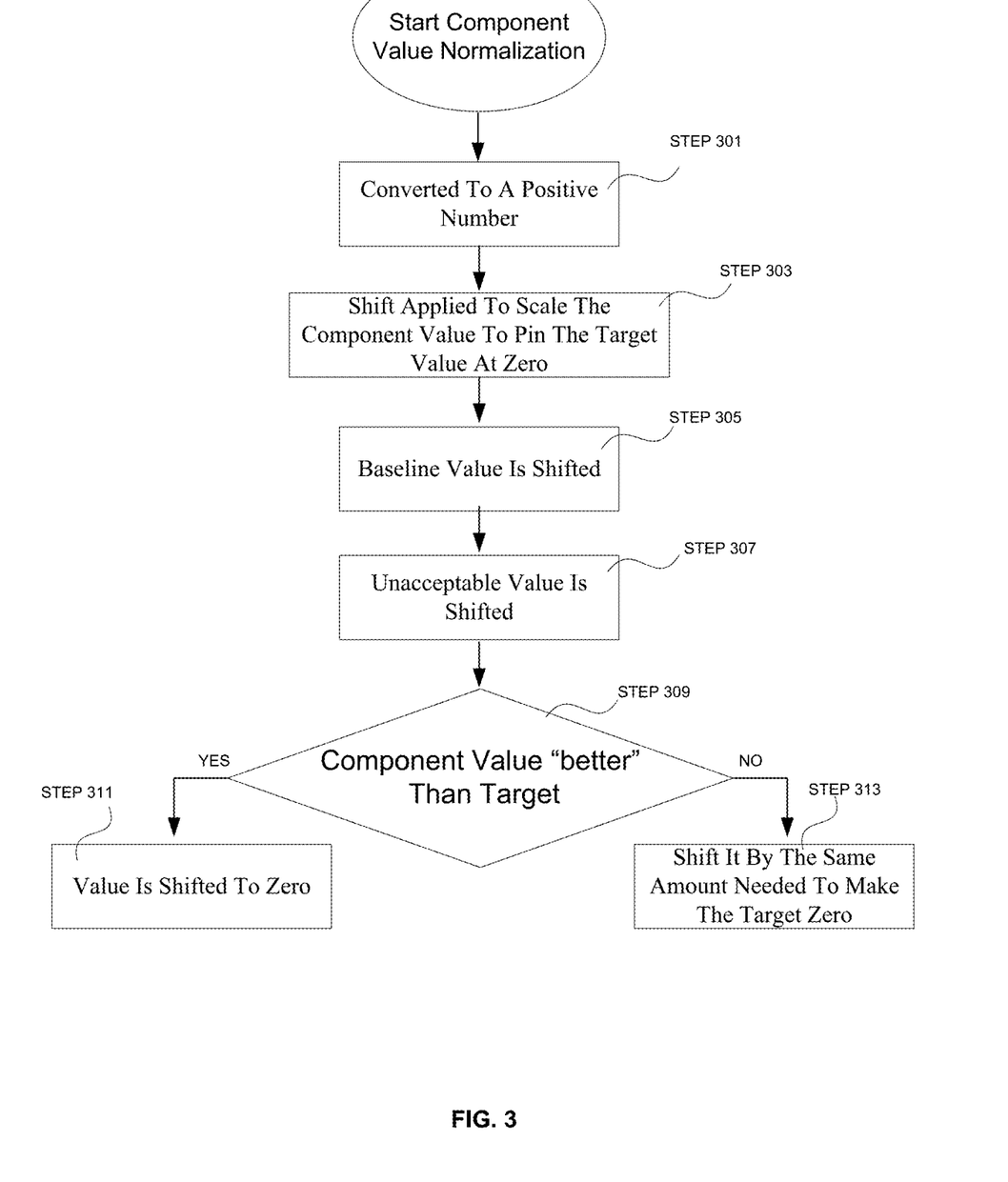
FIG. 3 is a flow diagram of the process for normalizing the component input values.

FIG. 3 is a flow diagram of the process for normalizing the component input values. Initially, the component input value is converted to a positive number that must be minimized (STEP 301). Next, there is a shift applied to scale the component input value to pin the component metric target value at zero (STEP 303). Next, the baseline value is shifted by the same amount needed to make the component metric target value zero (STEP 305). Next, the unacceptable value is shifted by the same amount needed to make the component metric target value zero (STEP 307). If the actual component input value for a chip implementation is "better" than the original component metric target value (STEP 309), its value is shifted to zero (STEP 311); otherwise shift it by the same amount needed to make the component metric target value zero (STEP 313).

The above transformations are dynamic and can continue throughout the entire search process. In some embodiments, the user may provide actual component metric target or baseline values for any component. When values are not provided, the disclosed method and apparatus self-configures the component input values. Self-configuration may continue until the end of the search.

Figure 4:
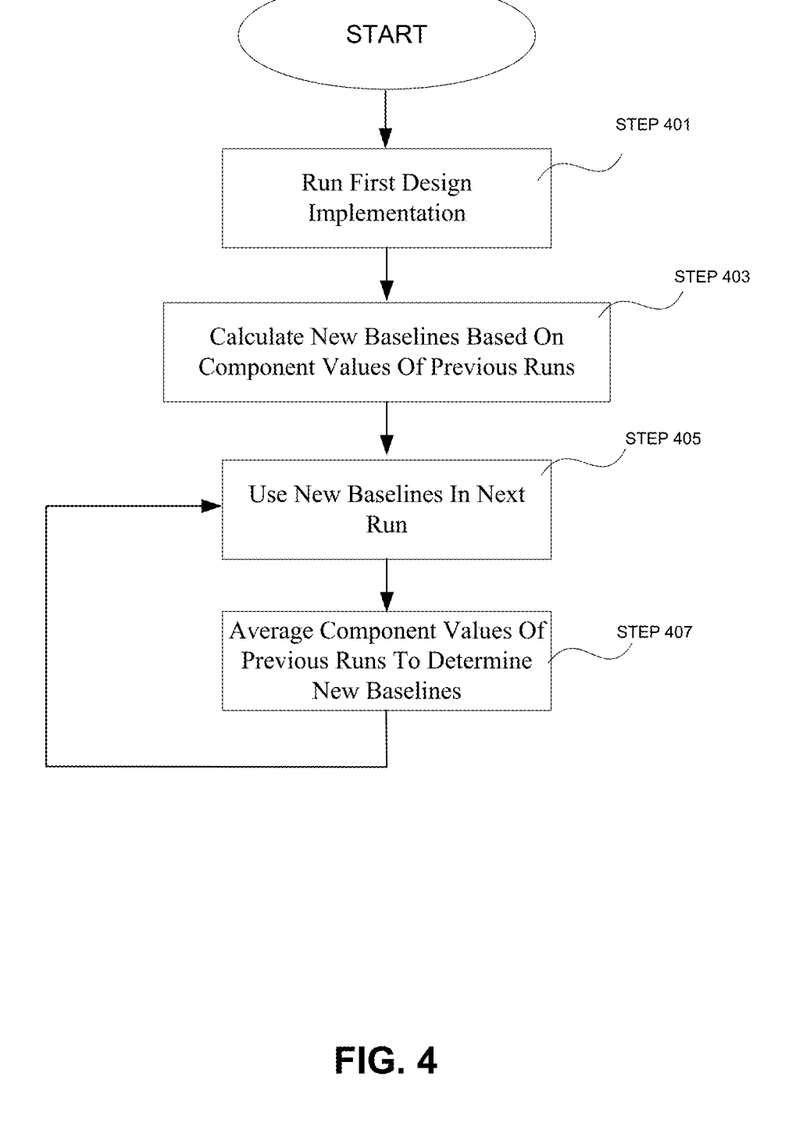
FIG. 4 is a flow diagram of the process of setting baseline values without designer input.

FIG. 4 is a flow diagram of the process of setting baseline values without designer input. In one example in which a designer presents 100 chip implementations with no explicit baselines (i.e., no baselines set by the designer). When the first implementation finishes (STEP 401), it becomes the source for any component baselines (STEP 403) that are lacking for running the next implementation (STEP 405). When the second implementation finishes running, new components baselines are calculated by taking the average of the two completed implementations (STEP 407). This process can continue until the end of the session, or until a special "baseline" run identified by the user completes. Accordingly, in some embodiments, an auto-baseline procedure is performed.

Some embodiments self-configure any component input values for which there are missing component metric target values. In some embodiments, the user specifies a component metric target multiplier. The method and apparatus calculate component metric target values by multiplying the baseline by this multiplier. If no component metric target multiplier is provided, default component metric target values are provided for those component input values for which no component metric target value has been set.

Each time baselines or component metric target values are updated, the process for calculating the AOV re-configures, and all design implementations are re-scored using the updated formula. As more implementations are completed, the process becomes more accurate, driving better and better design implementations.

Figure 5:
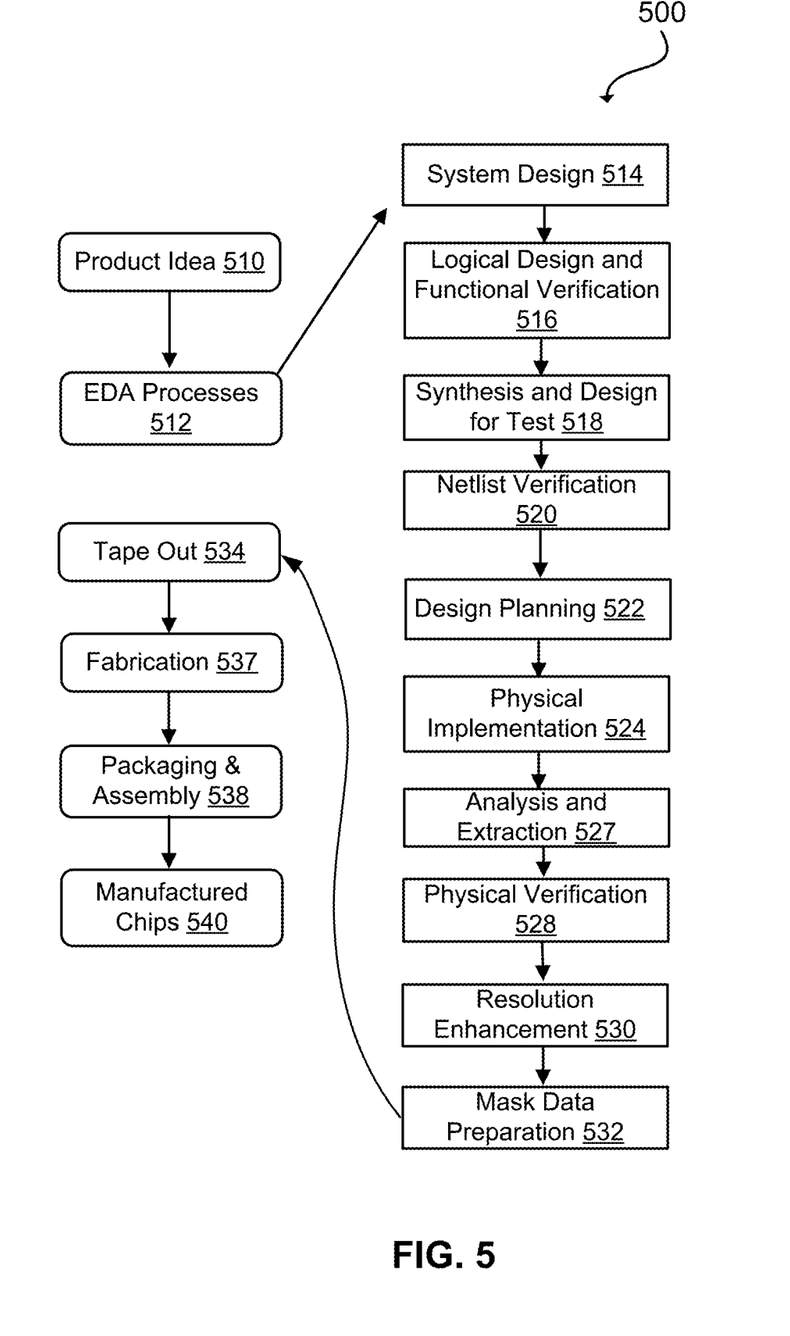
FIG. 5 illustrates an example set of processes used during the design, verification, and fabrication of an article of manufacture, such as an integrated circuit, to transform and verify design data and instructions that represent the integrated circuit.

FIG. 5 illustrates an example set of processes 500 used during the design, verification, and fabrication of an article of manufacture, such as an integrated circuit, to transform and verify design data and instructions that represent the integrated circuit. Each of these processes can be structured and enabled as multiple modules or operations. The term 'EDA' signifies the term 'Electronic Design Automation.' These processes start with the creation of a product idea 510 with information supplied by a designer. The information is transformed into/used to create an article of manufacture that uses a set of EDA processes 512. When finalized, the design is taped-out 534 and artwork (e.g., geometric patterns) for the integrated circuit is sent to a fabrication facility to manufacture a mask set. The mask set is then used to manufacture an integrated circuit. After tape-out, a semiconductor die is fabricated 536 and packaging and assembly processes 538 are performed to produce a finished integrated circuit 540.

Specifications for a circuit or electronic structure may range from low-level transistor material layouts to high-level description languages. A high-level of representation may be used to design circuits and systems, using a hardware description language ('HDL') such as VHDL, Verilog, System Verilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding tools of that layer (e.g., a formal verification tool). A design process may use a sequence depicted in FIG. 5. The processes described may be enabled by EDA products (or tools).

During system design 514, functionality of an integrated circuit to be manufactured is specified. The design may be optimized for desired characteristics, such as power consumption, performance, area (physical and/or lines of code), and reduction of costs, etc. Partitioning of the design into different types of modules or components can occur at this stage.

During logic design and functional verification 516, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 518, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 520, the netlist is checked for compliance with timing constraints and for correspondence with the HDL code. During design planning 522, an overall floor plan for the integrated circuit is constructed and analyzed for timing and top-level routing.

During layout or physical implementation 524, physical placement (positioning of circuit components such as transistors or capacitors) and routing (connection of the circuit components by multiple conductors) occur, and the selection of cells from a library to enable specific logic functions can be performed. As used throughout this disclosure, the term "cell" specifies a set of transistors, other components, and interconnections that provide a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products. These libraries contain the CCSN (Composite Current Source Noise), NLDM (Non-Linear Delay Model), CCST (Composite Current Source model for Timing), and ClCn models (a multi-segment receiver capacitance model) referenced above.

During analysis and extraction 527, the circuit function is verified at the layout level, which permits refinement of the layout design. The method and apparatus disclosed above for improving the accuracy of the CCSN models for receiver cells and driver cells may be implemented at this time. During physical verification 528, the layout design is checked to ensure that manufacturing constraints are correct, such as DRC constraints, electrical constraints, lithographic constraints, and that circuitry function matches the HDL design specification. During resolution enhancement 530, the geometry of the layout is transformed to improve how the circuit design is manufactured. The method and apparatus disclosed above for improving the accuracy of the CCSN models for receiver cells and driver cells may be implemented again at this time.

During tape-out, data is created to be used (after lithographic enhancements are applied if appropriate) for production of lithography masks. During mask data preparation 532, the 'tape-out' data is used to produce lithography masks that are used to produce finished integrated circuits.

Figure 6:
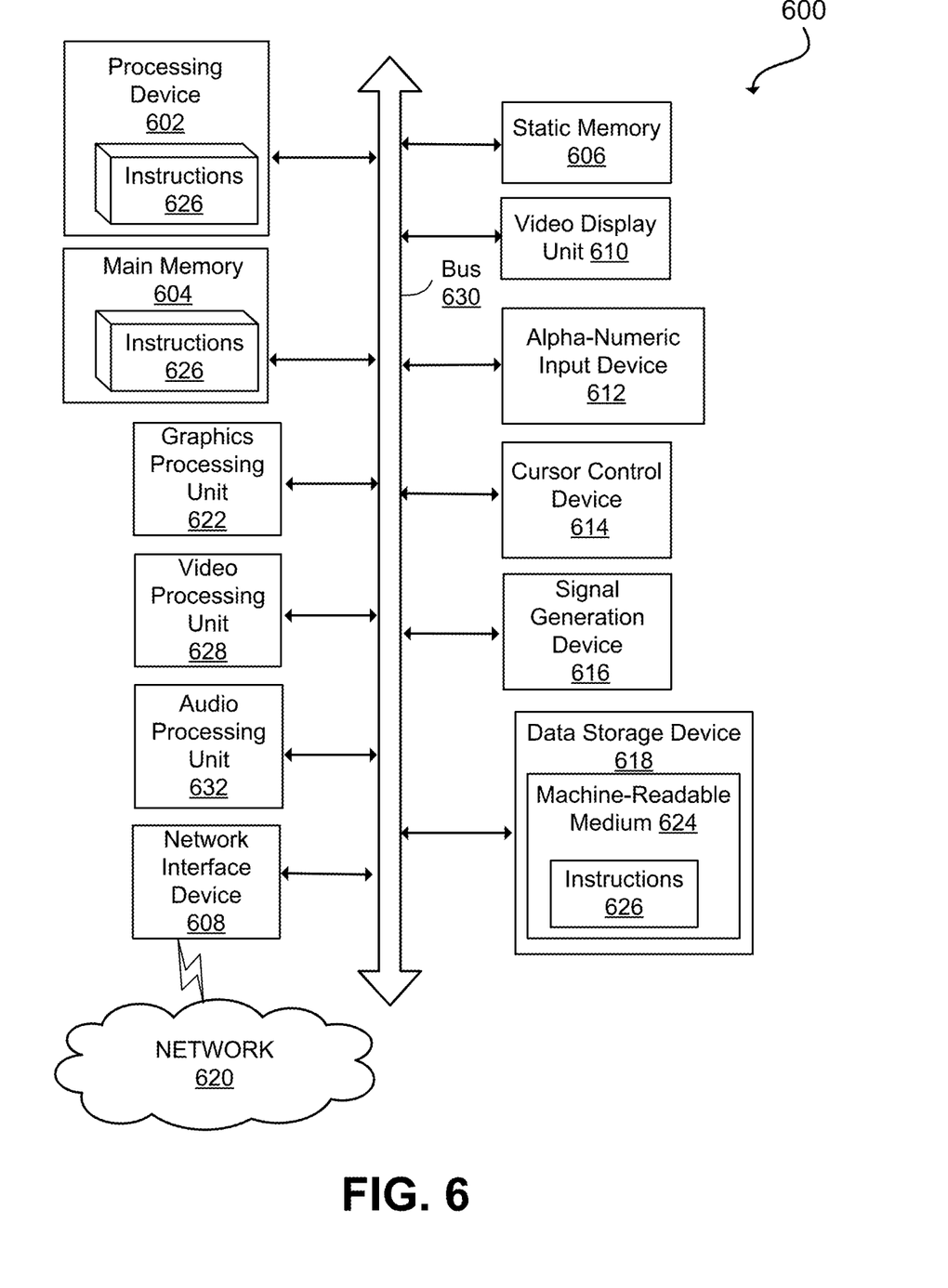
FIG. 6 illustrates an example machine of a computer system within which a set of instructions, for causing the machine to perform any one or more of the methodologies discussed herein, may be executed.

A storage subsystem of a computer system (such as computer system 600 of FIG. 10) may be used to store the programs and data structures that are used by some or all of the EDA products described herein, and products used for development of cells for the library and for physical and logical design that use the library.

FIG. 6 illustrates an example machine of a computer system 600 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM), a static memory 606 (e.g., flash memory, static random access memory (SRAM), etc.), and a data storage device 618, which communicate with each other via a bus 630.

Processing device 602 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 may also be one or more special-purpose processing devices such as an application specific integrated circuit (ASIC), a field programmable gate array (FPGA), a digital signal processor (DSP), network processor, or the like. The processing device 602 may be configured to execute instructions 626 for performing the operations and steps described herein.

The computer system 600 may further include a network interface device 608 to communicate over the network 620. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), a graphics processing unit 622, a signal generation device 616 (e.g., a speaker), graphics processing unit 622, video processing unit 628, and audio processing unit 632.

The data storage device 618 may include a machine-readable storage medium 624 (also known as a non-transitory computer-readable medium) on which is stored one or more sets of instructions 626 or software embodying any one or more of the methodologies or functions described herein. The instructions 626 may also reside, completely or at least partially, within the main memory 604 and/or within the processing device 602 during execution thereof by the computer system 600, the main memory 604 and the processing device 602 also constituting machine-readable storage media.

In some implementations, the instructions 626 include instructions to implement functionality corresponding to the present disclosure. While the machine-readable storage medium 624 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 602 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
   receiving, by one or more processing devices, input information including design criteria for an integrated circuit;
   selecting multiple component metrics based on the input information, the component metrics being related to at least one design element used to evaluate an aspect of performance of an integrated circuit produced in accordance with an integrated circuit design, based on the design criteria, and the component metrics being used to determine a single reward function output value;
   establishing for each of the component metrics, a component metric target value, each component metric target value being associated with a unique one of the component metrics and representing a value for the unique one of the component metrics beyond which the integrated circuit does not need to exceed, as determined by the input information received;
   establishing for each of the component metrics, an unacceptable value, each unacceptable value being associated with a unique one of the component metrics and representing a value associated with the unique one of the component metrics that would result in the integrated circuit not meeting one or more of the design criteria;
   establishing for each of the component metrics, a baseline value associated with a unique one of the component metrics, each baseline value being a value between the component metric target value and the unacceptable value for the value associated with the unique one of the component metrics;
   normalizing at least one of the component metrics using the component metric target value associated with a component metric to be normalized to provide at least one normalized component metric for each of the at least one of the component metrics;
   combining the at least one normalized component metric into the single reward function output value; and
   searching, by the one or more processing devices, via a machine-learning-based search, for an improved integrated circuit design based on the single reward function output value;
   changing the integrated circuit design to a new integrated circuit design, based on the machine-learning-based search and determining new component metric values, based on the new integrated circuit design, to attain a value for the single reward function output value, the new integrated circuit design defines a new integrated circuit that is an improvement over the integrated circuit defined by the integrated circuit design prior to the change.

2. The method of claim 1, wherein the normalizing includes normalizing multiple component metrics, wherein prior to the normalizing, one or more of the multiple component metrics have different units, scales and ranges from others of the multiple component metrics; and wherein each of the multiple component metrics has a baseline value and a target value; and the normalizing causing the baseline value of each of the component metrics to be the same as one another, and the target value of each of the component metrics to be the same as one another, which is the component metric target value.

3. The method of claim 2, wherein each weight for each of the component metrics is chosen such that a ratio of weights determines a relative priority assigned to meeting each target of each component metric.

4. The method of claim 1, wherein the single reward function output value is a weighted average of values of the component metrics.

5. The method of claim 1, further comprising:

converting a component input value to a positive number to be minimized;

applying a shift in a scale of the component input value to pin the component metric target value at a set value; and shifting the baseline value by an amount needed to make the component metric target value the set value.

6. The method of claim 1 further comprising:

determining that a component input value for a chip implementation of a chip is better than an original component metric target value, and shifting the component input value for the chip to a set minimum value, thereby changing the component metric target value to the component input value that is better.

7. The method of claim 1, further comprising:

setting baseline values without designer input;

receiving chip implementations with no explicit baselines; and when a first implementation is finished running, determining component baselines based on implementation.

8. The method of claim 7, further comprising:

when a second implementation finishes running, determining new components baselines; and the determining of the new component baselines including taking an average of a value based on the first implementation and a value based on the second implementation.

9. The method of claim 8, further comprising continuing to complete new implementations and computing new baselines based on new implementations until a baseline run ends.

10. The method of claim 1, further comprising:

determining that no component metric target was provided for one or more of the component metrics; and assigning default component metric target values for the one or more of the component metrics for which no component metric target value was provided.

11. The method of claim 1, further comprising:

transforming input parameters to an article of manufacture that uses Electronic Design Automation (EDA) processes;

taping out a design based on the EDA processes;

sending geometric patterns for the new integrated circuit to a fabrication facility to create a mask set;

fabricating a semiconductor die; and manufacturing the new integrated circuit based on the mask set.

12. The method of claim 1, wherein the searching searches a search space that includes at least $10^{12}$ combinations of input parameters and design choices.

13. The method of claim 1, further comprising:

creating a computer language description of the integrated circuit that is the improvement and storing the computer language descriptions of the integrated circuit on the non-transient memory.

14. The method of claim 13, wherein the computer language description is a hardware description language (HDL).

15. The method of claim 14, further comprising converting the HDL to a logic-level register transfer level (RTL) description.

16. The method of claim 15, further comprising transforming the HDL into a netlist.

17. The method of claim 16, wherein the netlist has a graph structure in which edges of the graph structure represent components of a circuit and wherein nodes of the graph structure represent how the components are interconnected.

18. A system comprising:

one or more machines having a processor; and a non-transient memory storing one or more machine instructions, which when implemented by the machine cause the machine to perform a method comprising:

receiving input information, via the one or more processing devices, the input information including design criteria for an integrated circuit;

selecting multiple component metrics based on the input information received, the component metrics being related to at least one design element used to evaluate an aspect of performance of an integrated circuit produced in accordance with an integrated circuit design based on the design criteria and the component metrics being used to determine a single reward function output value;

establishing for each of the component metrics, a component metric target value, each component metric target value having an associated component metric, the associated component metric being a component metric that is associated with a unique one of the component metrics and representing a value for the associated component metric beyond which the integrated circuit does not need to exceed, as determined by the input information received;

establishing for each of the component metrics, an unacceptable value, each unacceptable value being associated with a unique one of the component metrics and representing a value for the associated component metric that would result in the integrated circuit not meeting one or more of the design criteria;

establishing for each of the component metrics, a baseline value associated with a unique one of the component metrics, each baseline value being a value between the component metric target value and the unacceptable value for the associated component metric;

normalizing at least one of the component metrics using the component metric target value associated with the component metric to be normalized to provide at least one normalized component metric for each of the at least one of the component metrics;

combining the at least one normalized component metric into the single reward function output value;

searching, by the one or more processing devices, via a machine-learning-based search, for an improved integrated circuit design based on the single reward function output value;

changing the integrated circuit design to a new integrated circuit design based on the machine-learning-based search and determining new component metric values, based on the new integrated circuit design, to attain a value for the single reward function output value, the new integrated circuit design defines a new integrated circuit that is an improvement over the integrated circuit defined by the integrated circuit design prior to the change.

19. The system of claim 18, the normalizing including
   normalizing multiple component metrics, and prior to the normalizing, one or more of the multiple component metrics having different units, scales and ranges from others of the multiple component metrics;
   wherein each of the multiple component metrics having a baseline value and a target value; and
   the normalizing causing
      the baseline value of each of the component metrics to be the same as one another, and
      the target value of each of the component metrics to be the same as one another, which is the component metric target value.

20. A non-transient computer-readable medium storing one or more machine instructions, which when implemented by one or more machines having a processor, cause the one or more machines to implement operations comprising:
   receiving input information, via the one or more processing devices, the input information including design criteria for an integrated circuit;
   selecting multiple component metrics based on the input information received, the component metrics being related to at least one design element used to evaluate an aspect of performance of an integrated circuit produced in accordance with an integrated circuit design based on the design criteria and the component metrics being used to determine a single reward function output value;
   establishing for each of the component metrics, a component metric target value, each component metric target value having an associated component metric, the associated component metric being a component metric that is associated with a unique one of the component metrics and representing a value for the associated component metric beyond which the integrated circuit does not need to exceed, as determined by the input information received;
   establishing for each of the component metrics, an unacceptable value, each unacceptable value being associated with a unique one of the component metrics and representing a value for the associated component metric that would result in the integrated circuit not meeting one or more of the design criteria;
   establishing for each of the component metrics, a baseline value associated with a unique one of the component metrics, each baseline value being a value between the component metric target value and the unacceptable value for the associated component metric;
   normalizing at least one of the component metrics using the component metric target value associated with the component metric to be normalized to provide at least one normalized component metric for each of the at least one of the component metrics;
   combining the at least one normalized component metric into the single reward function output value;
   searching, by the one or more processing devices, via a machine-learning-based search, for an improved integrated circuit design based on the single reward function output value;
   changing the integrated circuit design to a new integrated circuit design based on the machine-learning-based search and determining new component metric values, based on the new integrated circuit design, to attain a value for the single reward function output value, the new integrated circuit design defines a new integrated circuit that is an improvement over the integrated circuit defined by the integrated circuit design prior to the change.

* * * * *